United States Patent
Alizadeh

(10) Patent No.: US 12,133,302 B2
(45) Date of Patent: Oct. 29, 2024

(54) SYSTEM AND METHOD FOR CONTROLLING ELECTRICAL DEVICES

(71) Applicant: SPA ELECTRICS PTY LTD, Dandenong (AU)

(72) Inventor: Mohammad Alizadeh, Dandenong (AU)

(73) Assignee: SPA ELECTRICS PTY LTD, Dandenong (AU)

( * ) Notice: Subject to any disclaimer, the term of this patent is extended or adjusted under 35 U.S.C. 154(b) by 139 days.

(21) Appl. No.: 17/756,227

(22) PCT Filed: Nov. 18, 2020

(86) PCT No.: PCT/AU2020/051246
§ 371 (c)(1),
(2) Date: May 19, 2022

(87) PCT Pub. No.: WO2021/097523
PCT Pub. Date: May 27, 2021

(65) Prior Publication Data
US 2022/0418063 A1 Dec. 29, 2022

(30) Foreign Application Priority Data

Nov. 19, 2019 (AU) .................................. 2019904346

(51) Int. Cl.
*H05B 47/10* (2020.01)
*H05B 45/20* (2020.01)
(Continued)

(52) U.S. Cl.
CPC ........... *H05B 45/20* (2020.01); *H05B 47/185* (2020.01); *H03M 5/08* (2013.01)

(58) Field of Classification Search
CPC ...... H05B 45/20; H05B 47/10; H05B 47/165; H05B 47/175; H05B 47/185; H03M 5/08
See application file for complete search history.

(56) References Cited

U.S. PATENT DOCUMENTS 6,967,448 B2 12/2005 Morgan et al.
9,900,963 B1 2/2018 Doll
(Continued)

FOREIGN PATENT DOCUMENTS

EP 2 728 972 B1 8/2015

OTHER PUBLICATIONS

EP Search Report from corresponding EP Application No. EP20889367 mailed May 9, 2023.

*Primary Examiner* — Long Nguyen
(74) *Attorney, Agent, or Firm* — Vorys, Sater, Seymour and Pease LLP

(57) ABSTRACT

A method and system for controlling electrical devices, such as lights capable of emitting different colours or colour sequences (shows). A multi-field command protocol is proposed to transmit command messages from a line controller to a controllable electrical device (light) to control its mode of operation, and optionally at least one dimension associated with the mode (e.g. light colour, and brightness and/or colour saturation, or blending colour show and speed of changing colours). The protocol comprises brief interruptions to the power supplied to the electrical device comprising a first variable length OFF time, a variable length ON time following the first OFF time, and a second variable length OFF time following the ON time. Together these times form three information fields having values represented by their respective lengths/durations. The fields define a selected mode of operation of the electrical device, and optionally at least one dimension associated with the mode.

16 Claims, 10 Drawing Sheets

(51) Int. Cl.
*H05B 47/185* (2020.01)
*H03M 5/08* (2006.01)

(56) References Cited

U.S. PATENT DOCUMENTS

| | | | |
|---|---|---|---|
| 11,632,835 B2 * | 4/2023 | Raposo | H05B 45/20 |
| | | | 315/152 |
| 2016/0286633 A1 * | 9/2016 | Juslen | H05B 41/38 |
| 2017/0006693 A1 | 1/2017 | Raposo et al. | |

* cited by examiner

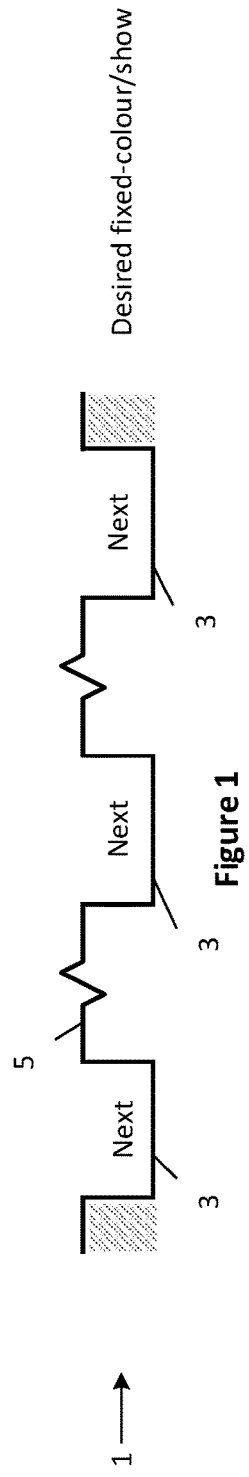
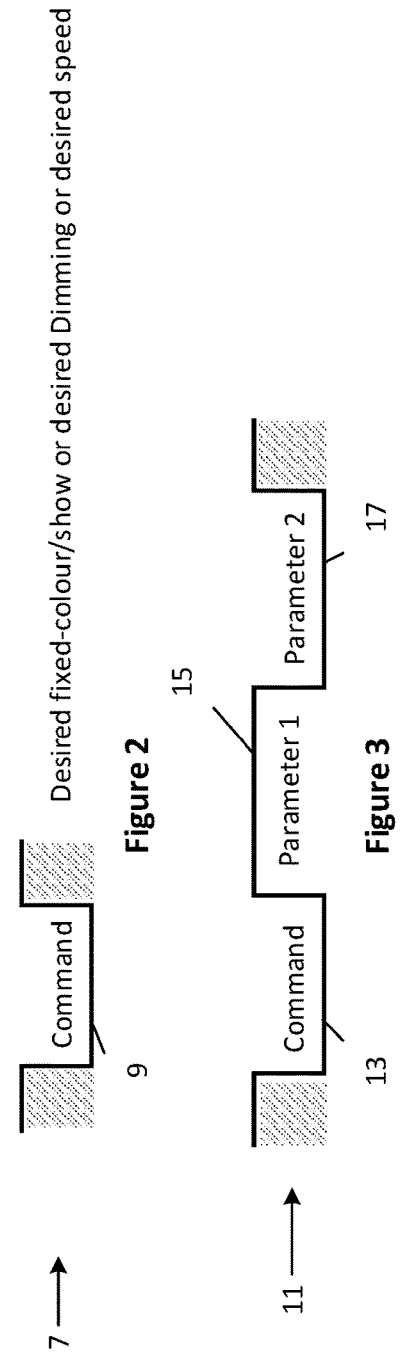

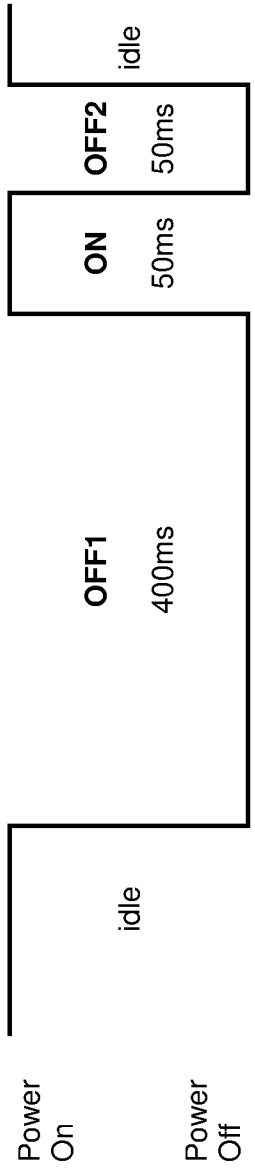

Figure 9

| | OFF1<br>Show code/<br>Fix Colour code<br>(ms) | | ON<br>Show speed /<br>Fix colour<br>Saturation<br>(ms) | | OFF2<br>Dimming Level<br>(ms) | | idle<br>Total<br>needed<br>Time range<br>(ms) | |
|---|---|---|---|---|---|---|---|---|
| | Min | Max | Min | Max | Min | Max | Min | Max |
| Show | 100 | 350 | 100 | 250 | 100 | 250 | 300 | 850 |
| Fix colour | 400 | 850 | 100 | 250 | 100 | 250 | 600 | 1350 |

Figure 10

| | OFF1<br>Show speed/<br>Fix Colour saturations<br>(ms) | | ON<br>Show code /<br>Fix colour<br>code<br>(ms) | | OFF2<br>Dimming Level<br>(ms) | | idle<br>Total<br>needed<br>Time range<br>(ms) | |
|---|---|---|---|---|---|---|---|---|
| | Min | Max | Min | Max | Min | Max | Min | Max |
| Show | 100 | 250 | 100 | 350 | 100 | 250 | 300 | 850 |
| Fix-colour | 300 | 450 | 100 | 550 | 100 | 250 | 500 | 1250 |

SYSTEM AND METHOD FOR CONTROLLING ELECTRICAL DEVICES

FIELD OF THE INVENTION

The present invention relates generally to systems and methods for controlling electrical devices. The invention is especially useful for controlling light fixtures of the type used in pool and spa lighting, and it will be convenient to describe the invention in relation to that example application. It must be understood however that the invention is capable of broader application and use.

BACKGROUND TO THE INVENTION

Underwater lighting systems, such as for pools and spas, are becoming increasingly sophisticated, with modern lighting devices typically using light-emitting diodes (LEDs) to produce light of various colours, or various combinations of colours which dynamically change over time. Similar developments are occurring in aboveground lighting systems such as those used for garden and landscape lighting. Numerous control schemes for such lighting systems have been developed over recent years and one popular scheme involves cycling the power supplied to the lighting device by briefly interrupting the line voltage, typically 12V AC but it could be DC and/or a different voltage. Each reverse "pulse" of the power line voltage (created by a brief disconnection of the supply) is interpreted by the light fixture connected to the power line as a command to change state, for example to change to the next colour or light show within a predefined sequence of available colours or shows.

Other more sophisticated communication schemes are being developed, or adapted from more general data communications technologies, such as data network communication links (wired or wireless), power line carriers, and other similar communications links, but they have often been found to be unreliable and/or expensive to implement when used in underwater or landscaping environments and in retrofitting installations.

Accordingly, to avoid the need for a costly communication link between a controller and a controlled device (such as a light fixture) to communicate information in order to control the mode of operation or relevant attributes of the controlled device, power cycling has been popular in industry, especially in the retrofit market. As long as the controlled devices are capable of continuing to function normally or in a predefined low-power mode during short power interruptions, and can resume normal operation after resumption of input power under the newly commanded mode, power interruption communication schemes have been found to be effective. As a result, light fixtures for pool and spa lighting have been developed to exploit this capability.

Typical multicolour pool lights that are operated with low voltage such as 12V AC as the power input (as well as operating/control) offer a set of n (usually 10 or more) fixed colour and/or blending/fading colour show sequences. These fixed colours or colour show sequences are generally referred to as operating "modes". In order to switch from a current mode to any other desired mode, a user needs to briefly interrupt the power to the light for a short amount of time, usually in the order of 1-5 seconds, and the light perceives this interruption as a command to switch to the next mode of operation in a predefined sequence. As such, a user may need to interrupter power to the light multiple times in order to advance to a desired colour or show.

This basic communication protocol is illustrated in FIG. 1 of the drawings wherein a line voltage waveform 1 shows a series of brief interruptions or "pulses" 3 (each pulse being a disconnection and subsequent reconnection) of the line voltage 5. Each successive pulse 3 is interpreted as a command to the light to advance to the next colour/show, and thus towards the desired mode. The zigzag symbol on line voltage 5 merely indicates variation of any length in time between successive pulses 3.

In this basic communication protocol, a short pulse is interpreted by the light as being a command to advance to the next mode while a very long pulse or an extremely short pulse is used to command a predetermined default mode, such as a reset. Accordingly, such a light has a command set of size 2, i.e. only 2 commands to operate the light, namely Next Colour and Reset. For a light offering a set of n modes, power interruptions would need to be repeated (n−1) times in the worst case to land on the desired mode, taking at least about 2*(n−1) seconds, which for a 10-mode example comes to at least 18 seconds, assuming at least 2 seconds needed for generating each pulse manually.

A shortcoming of this protocol was that it provided only one-dimensional control, meaning only one aspect or attribute of the light (i.e. either colour mode or brightness, or show speed) was controlled. On the other hand, generating power interruptions for controlling such a light by the user, did not require the use of sophisticated electronics with precise timing and could be performed using a simple manual switch.

From around 2015, a newer and more effective protocol was introduced to industry where the desired mode was selectable with only one pulse, but with a variable length of Off-time to determine which of n available modes is intended. This protocol is illustrated in FIG. 2 wherein a power line voltage waveform 7 has a variable length command pulse 9.

If we consider a command set size n=10, power interruptions starting from 50 ms to 50+(n−1)*50 ms in granularity/increments of 50 ms for example, enable switching to one of 10 modes in 0.5 s. Compared to the aforementioned example, where the worst case took 18 s, the improvement/speed factor introduced by this protocol was 3600%. In other words, it took a user 2.78% of the time required to get the same result.

A by-product feature of this protocol was a multidimensional control capacity, compared to the previous protocol. In this regard, the Off-time can be divided into different regions, and intervals within each region can control one aspect of the light, e.g. colour mode, brightness, or speed, within one user interaction. However, any single user interaction, and thus any individual command message, could control only one of a few supported features/dimensions. The number of features/dimensions was thus limited because it is generally considered that the length of the resulting worst-case Off-time must still be short enough for an acceptable real-time user experience. Generating power interruptions with such precise timing requirements (interruptions with granularity/increments of 50 ms) also needed an electronic line controller, and a manual switch could not be used to deterministically operate the light.

With the limitations of prior art protocols in mind, it would be desirable to provide a more powerful and flexible command protocol that enables a greater number of modes of operation and/or greater numbers of dimensions associated with each mode to be controlled simultaneously.

Any discussion of documents, devices, acts or knowledge in this specification is included to explain the context of the invention. It should not be taken as an admission that any of the material formed part of the prior art base or the common general knowledge in the relevant art on or before the priority date of the claims herein.

SUMMARY OF THE INVENTION

To overcome the one-dimension-at-a-time control shortcoming of existing protocols and to provide a much larger set of achievable commands within real-time constraints (such as under 1.5 seconds) a new protocol is proposed. The new protocol also utilises selective interruption of power supplied to a controlled electrical device but is based on a recognition that a variable-length power ON time, between successive variable-length power OFF time pulses, can be used to encode an expanded command pool compared to a single variable-length pulse, or a series of pulses in sequence, as used in the prior art.

In its basic form, the proposed protocol therefore comprises three variable components, representing three discrete fields that can be used, in a flexible manner, to encode many more commands and/or parameters for controlling an electrical device, and do so in one reasonably quick user-to-device interaction.

The new protocol thus offers a minimum of 3 degrees of freedom (and has thus been given the name "3DOF" by the inventor) versus one degree of freedom in existing protocols. The 3DOF protocol allows for an ample number of multi-field commands to be conveyed from a controller to a light fixture in a very short amount of time. In one example the new 3DOF protocol takes the size of the command pool from somewhere in the order of about 10, as is common in the prior art, to at least a few hundred or even around a thousand. And it provides for simultaneous multidimensional control whereby more than one aspect or dimension of the controlled device can be selected in a single, relatively brief, user interaction/transaction.

It will be appreciated by persons skilled in the art that the 3DOF concept can be readily extended to include additional ON and OFF times such that two ON times between three OFF times would become a 5DOF protocol, three ON times between four OFF times would become a 7DOF protocol, and so on such that, more generally, the protocol could be considered mDOF. These extensions provide the possibility of even greater command pools and/or multidimensional command and parameter combinations to enable simultaneous control of modes of operation and associated dimensions in a single user interaction and single command message.

Based on the new protocol the present disclosure provides a method and system for controlling electrical devices, such as light fixtures capable of emitting different fixed colours or colour sequences (shows). The method and system use a multi-field command protocol to transmit command messages from a line controller to at least one electrical device (such as a light fixture) to control a mode of operation of the electrical device, and optionally with at least one dimension associated with the mode of operation (for example the colour of light together with desired characteristics such as brightness and/or colour saturation (the proportion of white light mixed with the colour), or a light blending colour show comprising a sequence of changing colours together with desired characteristics such as the speed of change of colours). The protocol for the command message comprises brief interruptions to the power supplied to the electrical device comprising:

a first variable length OFF time,
a variable length ON time following the first OFF time, and
a second variable length OFF time following the ON time,
wherein the first OFF time, the ON time and the second OFF time form three information fields having values represented by their respective lengths/durations. These fields define a selected mode of operation of the electrical device, and optionally at least one selected dimension associated with the mode of operation.

The proposed protocol thus relies on interrupting output power of the line controller that is driving and powering up the controlled electrical device. The proposed method teaches sending a command message with at least three variable components, or information fields, in one reasonably quick user-to-device interaction. Users are thereby able to send a command message for a selected mode or dimension, out of n defined commands in a command set, in a single message and see the device respond/react in a short period of time. This period may vary among systems, but total times of about 1.5 seconds have been found to be acceptable, and are considered "real-time" in terms of the user experience.

An example of such a controller and device pair can be a home automation controller and a 12V AC pool or garden light capable of producing various colours or blending colour show sequences, and optionally having different levels of output brightness/dimming or running the blending light shows at different speeds, all selectable by the user through a controller user interface (UI).

Throughout this disclosure the term "electrical device" is to be understood to include any AC or DC powered electrical device such as a light, pool light, spa light, garden light, irrigation systems, wired underground apparatus, mining apparatus, alarm systems, apparatus in railway industries, etc., including a plurality of such devices powered and controlled together on a single power line. The term "pulse" is to be understood to mean any single short power interruption where input power to the device is turned off and turned back on within a short period of time. The phrase "single user interaction" is to be understood to mean a user experience where the user selects a command from user interface (UI) by pressing a button on the controller itself or its UI (which could be a remote control handset, mobile phone app, etc.) and expects a quick response, say within 1.5 seconds or less, as a response from the controlled electrical device. Another form of a single user interaction could be the user specifying a command together with a scheduled execution time/day (an event) which is stored in the line controller memory. Later on, whenever the real time clock matches the event time, the line controller executes the stored command. For example, the user can specify for the lights to turn on at 8 pm on every Monday. With the advent of voice-controlled UIs such as Amazon Echo, Google Home Assistant and Apple Siri, the definition of a "single user interaction" can also be extended to a user verbally asking a voice-controlled device to send a request to the line controller, hence a command to controlled devices.

In one specific form, an aspect of the present invention provides a method of controlling the operation of an electrical device within an electrical system, the method comprising the steps of:

receiving, at a line controller of the electrical system, a user-selected mode of operation for the electrical device;
generating a command message corresponding to the user-selected mode of operation by operating a switching device of the line controller to selectively interrupt power to the electrical device, wherein the command
message encodes the user-selected mode of operation
in accordance with a multi-field command protocol
comprising:
  a first variable length OFF time;
  a variable length ON time following the first variable
    length OFF time; and
  a second variable length OFF time following the variable length ON time,
wherein the first OFF time, the ON time and the second
  OFF time form three discrete fields of the command
  message, with each field having a value represented by
  its length, and at least one of the fields, or the three
  fields together, define a command to control the electrical device in accordance with the user-selected mode
  of operation;
receiving, at an electrical device of the electrical system,
  the command message; and
operating the electrical device in accordance with the
  user-selected mode of operation.

In one embodiment of the method, the user-selected mode of operation includes at least one dimension associated with the mode of operation. In this embodiment at least one of the three fields of the command message defines a parameter to control the electrical device in accordance with the user-selected dimension. The electrical devices then operate in accordance with the user-selected mode of operation and associated dimensions(s).

In another embodiment, the user-selected mode of operation may include two dimensions associated with the mode of operation. In this embodiment the three fields of the command message may together define a command and two parameters to control the electrical device in accordance with the user-selected mode of operation and the two associated dimensions.

In a more specific example, the user-selected mode of operation includes a first dimension and a second dimension, each dimension being associated with the mode of operation of the electrical device. In this example, one of the three fields defines a command to control the electrical device in accordance with the user-selected mode of operation. Another of the three fields defines a first parameter to control the electrical device in accordance with the user-selected first dimension. The remaining field of the three fields defines a second parameter to control the electrical device in accordance with the user-selected second dimension.

In one embodiment, the first dimension and/or the second dimension can be a null dimension such that the respective first parameter and/or second parameter carry a predetermined null value.

In one embodiment, the mode of operation and associated dimension(s) may be selectable by the user in a single interaction. The line controller may then encode the user-selected mode of operation and associated dimension(s) in a single command message.

In an example application, the electrical system comprises a lighting system, such as a pool, spa or landscape lighting system, and the controllable electrical device comprises a light fixture, such as a pool or spa light, a garden or landscape light, a deck light or strip LED, or a water feature light. In this application, the selectable modes of operation may include static/fixed light colours and/or light shows comprising sequences of changing light colours, and the selectable dimensions may include at least one of brightness, colour saturation, and/or show speed. Alternatively, one of the fields of the command message may be used to convey an address of a targeted light and/or address of a targeted group of lights.

To meet user expectations, the total message time should be as short as possible, and preferably less than about 1.5 seconds.

In one embodiment, the electrical system may include a plurality of electrical devices connected to a power line of the electrical system. In this embodiment, the method may further comprises the steps of:
  receiving, at the line controller, a user-selected target
    electrical device or group of electrical devices;
  generating a command message corresponding to the
    user-selected mode of operation and the targeted electrical device or group of electrical devices, such that at
    least one of the fields of the command message defines
    an address to control the targeted electrical device or
    group of electrical devices in accordance with the
    user-selected mode of operation;
  receiving, at the plurality of electrical devices, the command message; and
  operating the targeted electrical device or group of electrical devices in accordance with the user-selected
    mode of operation It will be appreciated by a person skilled in the art that the method of the invention has advantage in applications where wired communication/signalling over power is the preferred or is the only feasible method of communication between two devices for cost effectiveness, availability, reliability or other reasons.

Another aspect of the present invention provides an electrical system comprising:
  at least one controllable electrical device; and
  a line controller, connectable to the electrical device via a
    power line, for providing power to the electrical device
    and for controlling a mode of operation of the electrical
    device, the line controller comprising a switching
    device for selectively interrupting power to the electrical device in accordance with a command message
    corresponding to a user-selected mode of operation,
    wherein the command message encodes the user-selected mode of operation in accordance with a multi-field command protocol comprising:
    a first variable length OFF time;
    a variable length ON time following the first variable
      length OFF time; and
    a second variable length OFF time following the variable length ON time,
  wherein the first OFF time, the ON time and the second
    OFF time form three discrete fields of the command
    message, with each field having a value represented by
    its length, and at least one of the fields, or the three
    fields together, define a command to control the electrical device in accordance with the user-selected mode
    of operation.

As with the method described above, the system may allow for a user-selected mode of operation including at least one dimension, and preferably two dimensions. The system may also be configured to enable a user-selected target electrical device, or group of electrical devices, to be controlled in accordance with a user-selected mode of operation, and optionally any associated dimensions.

In one embodiment the electrical system comprises a lighting system, and each light fixture within the lighting system may comprise an LED pool light.

A further aspect of the present invention provides a line controller connectable to an electrical device via a power line, for providing power to the electrical device and for controlling a mode of operation of the electrical device. The line controller comprises a switching device for selectively interrupting power to the electrical device in accordance with a command message corresponding to a user-selected mode of operation, wherein the command message encodes the user-selected mode of operation in accordance with a multi-field command protocol comprising:
  a first variable length OFF time;
  a variable length ON time following the first variable length OFF time; and
  a second variable length OFF time following the variable length ON time,
wherein the first OFF time, the ON time and the second OFF time form three discrete fields of the command message, with each field having a value represented by its length, and at least one of the fields, or the three fields together, define a command to control the electrical device in accordance with the user-selected mode of operation.

In one embodiment the line controller comprises a user interface to enable a user to select a desired mode of operation, and optionally one or more dimensions associated with the mode of operation. The user interface may be provided remotely from the line controller and may, for example, be provided as a hand-held remote control or in the form of an app which is operable on a mobile computing device such as a smartphone.

A further aspect of the present invention provides controllable electrical device operable within an electrical system and having a plurality of selectable modes of operation. The controllable electrical device is connectable to a power line of the electrical system and is configured to detect selective interruptions of power on the power line representing command messages, each command message having encoded therein a user-selected mode of operation in accordance with a multi-field command protocol comprising:
  a first variable length OFF time;
  a variable length ON time following the first variable length OFF time; and
  a second variable length OFF time following the variable length ON time,
wherein the first OFF time, the ON time and the second OFF time form three discrete fields of the command message, with each field having a value represented by its length, and at least one of the fields, or the three fields together, define a command to control the electrical device in accordance with the user-selected mode of operation. The device also comprises a microcontroller for decoding the command message and operating the device in accordance with the user-selected mode of operation.

In one embodiment of the electrical device, each mode of operation has at least one selectable dimension associated with the mode of operation. In this embodiment the microcontroller is configured to decode command messages having encoded therein a user-selected mode of operation and at least one user-selected dimension associated with the mode of operation. The user-selected dimension(s) may be identified within the command message by a parameter defined by at least one of the three fields. The microcontroller is then configured to operate the electrical device in accordance with the user-selected mode of operation and the associated dimension(s).

In one embodiment of the electrical device, each mode of operation has two selectable dimensions associated with the mode of operation. In this embodiment the microcontroller may be configured to decode command messages having encoded therein a user-selected mode of operation and two user-selected dimensions associated with the mode of operation. The user-selected mode of operation may be identified within the command message by a mode command defined by one of the three fields, a first user-selected dimension may be identified within the command message by a first parameter defined by another of the three fields, and a second user-selected dimension being identified within the command message by a second parameter defined by the remaining field of the three fields. The microcontroller may then be configured to operate the electrical device in accordance with the user-selected mode of operation and the two associated dimensions.

In one example application, the controllable electrical device may be a light fixture, such as a pool or spa light, a garden or landscape light, a deck light or strip LED, or a water feature light. In this application the selectable modes of operation may include static/fixed light colours and/or light shows comprising sequences of changing light colours. The selectable dimensions may include at least one of brightness, colour saturation, and/or show speed.

In one embodiment the modes of operation and associated dimension(s) may form lighting profiles of the light fixture. The light fixture may, for example, be an LED pool light.

In one example implementation, the protocol for the command message may comprise:
  a first OFF time defining a command to control a mode of operation of the electrical device,
  an ON time following the OFF time and defining a first parameter for controlling a first dimension associated with the mode of operation, and
  a second OFF time following the ON time and defining second parameter for controlling a second dimension associated with the mode of operation.

However, the protocol is flexible and the purpose of each message component, or field, may be swapped around. For example, the command for the mode of operation may be defined by the ON time or the second OFF time, and the first and second parameters for the dimensions may be swapped to one of the other two fields.

In the claims which follow and in the description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

To assist the further understanding of the invention, reference is now made to the accompanying drawings which illustrate preferred embodiments of the invention. It is to be appreciated that these embodiments are given by way of illustration only and the invention is not to be limited by this illustration.

BRIEF DESCRIPTION OF THE DRAWINGS

FIG. 1 depicts a voltage waveform for a command message using a prior art command protocol wherein successive high/low/high voltage pulses indicate power is sequentially connected/disconnected/connected to a light.

FIG. 2 depicts a voltage waveform for another command message using another prior art command protocol featuring a variable length OFF-time pulse.

FIG. 3 depicts a voltage waveform for a command message using an embodiment of the 3DOF protocol of the present invention, this embodiment involving a variable length ON-time between two variable-length OFF-time pulses.

FIG. 4 depicts an example command message using the 3DOF protocol and depicting the fields of the command message OFF1, ON, OFF2 together with their time encoding ranges, the granularity assumed to be 50 ms in this example.

FIG. 7 depicts an alternative no-parameter command message to set the light to colour show 3, with no change to speed or brightness (Null values for ON and OFF2).

FIGS. 8 to 10 depict other embodiments of 3DOF command messages using alternative Command Formats.

DESCRIPTION OF PREFERRED EMBODIMENTS

Figures 5, 6:
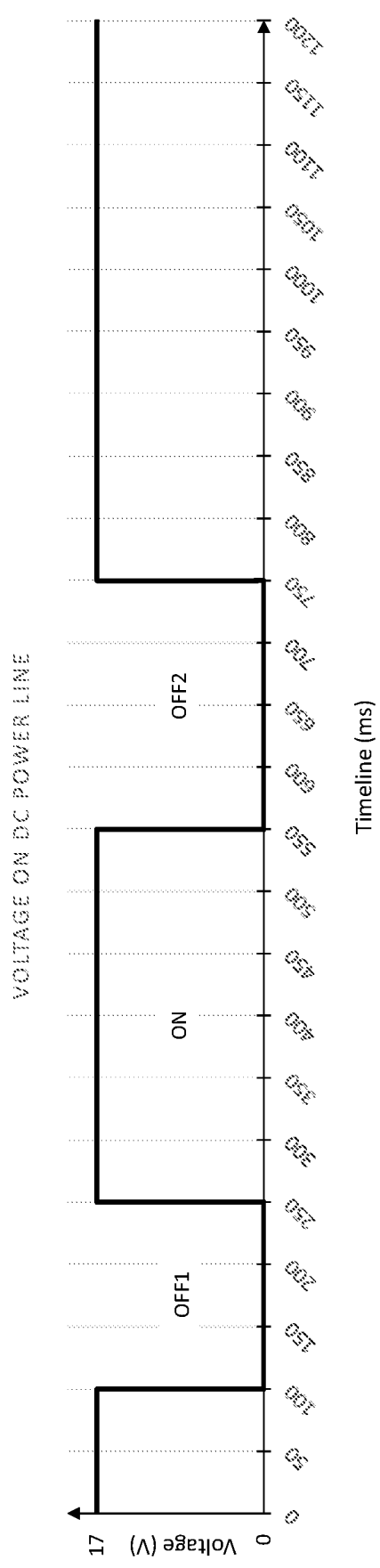
FIG. 5 depicts a 3DOF command waveform to set a light to fixed-colour Green, 75% saturation, 50% brightness in an example DC powered system.
FIG. 6 depicts a 3DOF command waveform to set a light to fixed-colour Green, 75% saturation, 50% brightness in an example AC powered system.

One example embodiment of the proposed 3DOF protocol is illustrated in FIG. 3. In this example a power line voltage waveform 11 is encoded with a command message comprising two variable-length OFF pulses 13, 17 and a variable-length ON time period 15 between the OFF pulses 13, 17. The length/period of the first OFF time pulse 13 defines a Command to control a mode of operation of a connected electrical device. The length/period of the ON time 15 may be used to define a first parameter, Parameter 1, determining a first dimension associated with the mode of operation. The length/period of the second OFF time pulse 17 may be used define a second parameter, Parameter 2, determining a second dimension associated with the mode of operation.

Other possible variations of the 3DOF protocol are set out in Table 1 below. Each variation corresponds to a different Command Format, where the field allocation for the Command, Parameter1 and Parameter2 is different in each Format. Table 1 shows possible allocations of the three Fields identified across the top as OFF1, ON, OFF2, for each of the Command Formats identified as Two-param #1, Two-param #2, etc., down the left-hand side of the table. The particular example illustrated in FIG. 3 corresponds to the first Command Format in Table 1, namely Two-param #1 wherein the fields OFF1, ON, OFF2 are allocated to the Command, Parameter1 and Parameter2. In some of the variations, such as One-param #1, only one parameter is specified (in field ON in this command format) and the other parameter is given a NULL value (in field OFF2 in this command format). In the last three variations, e.g. No-param #1, no parameters are specified and two of the fields are given a NULL value.

A typical system may use a combination of the command formats described in Table 1. In those cases where one command format uses a field as a 'command' and another format uses the same field as a 'parameter', different encoded value ranges can be used to distinguish and separate them from each other.

Taking a pool light as an example of a controlled device, a dimension can be considered to be light colour, light saturation level (the proportion of white light mixed with a colour), light show running speed or brightness level. Parameter 1 and/or Parameter 2 may be used to specify these dimensions together with a Command which specifies the mode of operation (fixed colour vs show). Alternatively, at least one of the Parameters may be used to specify an address of a targeted light or address of a group of lights connected to the same power line. A Command may also order a light to perform a predefined action such as "save" a currently displaying colour shade, "Recall" last saved colour shade, "Next" brightness level, "Previous" brightness level, "Rewind" colour show, "Reverse" colour show, "Make" a beep sound, "Play" a song, and so on. Commands of this type may also have one or more "dimensions" associated with the specified action.

TABLE 1

3DOF Command formats

| Command format | Allocation of Field | | |
|---|---|---|---|
| | OFF1 | ON | OFF2 |
| Two-param #1 | Command | Parameter1 | Parameter2 |
| Two-param #2 | Parameter1 | Command | Parameter2 |
| Two-param #3 | Parameter1 | Parameter2 | Command |
| One-param #1 | Command | Parameter | NULL |
| One-param #1 | Command | NULL | Parameter |
| One-param #2 | NULL | Command | Parameter |
| No-param #1 | Command | NULL | NULL |
| No-param #2 | NULL | Command | NULL |
| No-param #3 | NULL | NULL | Command |

One possible implementation of the 3DOF protocol may encode user-selected colour/show, brightness/dimming level, speed or saturation dimension as variable length times within a two-click pulse (i.e. double pulse) from the controller (as shown in FIG. 3) to the light where, in one embodiment there is a first OFF time (conveying the show selection) followed by an ON time (conveying speed level), then followed by a $2^{nd}$ OFF time (conveying the brightness/dimming level) info. Each of these time intervals can be as short as 500 ms max (allowing for 9 codes assuming 50 ms granularity starting from a valid pulse as short as 100 ms), resulting in 9*9*9=729 permutations theoretically and achieved in total command time of 1.5 seconds.

It should be noted that the granularity value (50 ms in the above example) is determined by the accuracy of the controller hardware/software in generating those OFF/ON time intervals, and also by the accuracy of the controlled device in measuring them. Therefore, in systems with higher accuracies, shorter/finer granularities can be implemented to achieve a larger set of commands in a given time limit. With the granularity of N milliseconds, the measurement error of up to ±N/2 milliseconds around a nominal value can be tolerated and rounded to that nominal value. Assuming a granularity of 50 ms, the error of ±25 ms can be tolerated, e.g. measurements of 110 ms, 89 ms, 76 ms, and 124 ms are all considered as a nominal 100 ms reading.

FIG. 4 and Table 2 together illustrate an example embodiment of the proposed 3DOF protocol where the light can operate on one of 10 fixed colours with a choice of 4 levels of saturation and 4 levels of brightness. It can also operate on 6 blending light shows with a choice of 4 running speeds and 4 levels of brightness (dimming).

Assuming that the Fix-colour saturation (OFF1) defines the mode of operation and the Fix-colour code and brightness are its dimensions (ON and OFF2 respectively), it can be seen that the Fix colour Command type in this embodiment is compatible with the "Two-param #1" Command Format in Table 1. Also considering that Show code (OFF1) defines the mode of operation, and the show speed and brightness (dimming) levels are its dimensions (ON and OFF2 respectively), it can be seen that the "Colour show" command type in this embodiment is also compatible with the "Two-param #1" Command Format in Table 1. It should be noted that the OFF1 field values differentiate whether the command is for a fixed-colour or a show. In this example, an off-time between 100 and 250 ms characterises the command as being for a fixed colour mode (with the selected colour being defined by the ON field) and an off-time between 300 and 550 ms characterises the command as being for a colour show mode (with the selected show also being defined by the OFF1 field).

It should be noted that the "Power On" and "Power Off" states of the waveform shown in FIG. 4 indicate the power is connected to the light or disconnected, respectively. As shown in Table 2, for the "Fix-colour" row in the table below the waveform, the OFF1 field of the command message represents one of the 4 saturation levels, having values of 100%, 75%, 50% or 25% (see Table 2), encoded with an OFF-time length (i.e. time periods) of 100 ms, 150 ms, 200 ms, or 250 ms, respectively. For the OFF1 field of at least 100 ms and at most 250 ms representing a valid saturation level for a fixed-colour, the subsequent ON field then represents one of the 10 fixed-colours, having values of white, aqua, . . . , magenta, or purple, encoded by ON-time lengths of 100 ms, 150 ms, . . . , 500 ms, or 550 ms, respectively. The subsequent OFF2 field of the command message then represents one of the 4 different brightness/dimming levels, having values of 100%, 75%, 50% or 25%, encoded with OFF-time lengths of 100 ms, 150 ms, 200 ms, or 250 ms, respectively. It should be noted that the longest (i.e. slowest) command takes 1050 ms to be sent. A detailed description of what is meant by each field (Command/Parameter) value and respective timing, in milliseconds (ms), can be looked up from Table 2.

For example, a command message in this embodiment to set the light to a fixed colour Green, with saturation level of 75% and brightness level of 50% would be OFF1, ON, and OFF2 nominal period of 150, 300, 200 ms, respectively. For this command message, the example command waveforms in FIGS. 5 and 6 illustrate the voltage waveform of the power line from the line controller to the light, depending on whether the nature of the power is DC (FIG. 5) or AC (FIG. 6).

Similar to fixed-colours, as shown in FIG. 4 and FIG. 7, "Colour show" commands are defined such that, the OFF1 field of the command message represents one of the 6 predefined colour shows, labelled as Show 1 to Show 6 in Table 2, encoded as OFF-time lengths (i.e. periods) of 300 ms, 350, 400, 450, 500, or 550 ms. The subsequent ON field then represents one of the 4 show effect running speed levels, having values of Low, Medium, High or Very High, encoded by ON-time lengths of 100 ms, 150 ms, 200 ms or 250 ms, respectively. The subsequent OFF2 field of the command then represents one of the 4 different brightness/dimming levels, having values of 100%, 75%, 50% or 25%, encoded with OFF time lengths of 100 ms, 150 ms, 200 ms, or 250 ms, respectively. It should be noted that the longest/slowest command again takes 1050 ms to be sent. A detailed description of what is meant by each field (Command/Parameter) value and respective timing can be looked up from Table 2 in this example.

If any of the OFF1, ON, or OFF2 fields are less than a minimum time period, i.e. less than nominal 25 ms shown in Table 2 in this example, the light fixture would discard the whole command message as being invalid.

TABLE 2

3DOF command time encodings for discussed embodiment
3DOF command time encodings

| Command/parameter | Time length (ms) |
|---|---|
| SET FIXED COLOURS | |
| WHITE | 100 ± 25 |
| AQUA | 150 ± 25 |
| BLUE | 200 ± 25 |
| TURQUOISE | 250 ± 25 |
| GREEN | 300 ± 25 |
| LIME | 350 ± 25 |
| ORANGE | 400 ± 25 |
| RED | 450 ± 25 |
| MAGENTA | 500 ± 25 |
| PURPLE | 550 ± 25 |
| SET COLOUR SHOWS/BLENDS | |
| SHOW 1 | 300 ± 25 |
| SHOW 2 | 350 ± 25 |
| SHOW 3 | 400 ± 25 |
| SHOW 4 | 450 ± 25 |
| SHOW 5 | 500 ± 25 |
| SHOW 6 | 550 ± 25 |
| SET SHOW SPEED | |
| LOW | 100 ± 25 |
| MEDIUM | 150 ± 25 |
| HIGH | 200 ± 25 |
| VERY HIGH | 250 ± 25 |
| SET FIXED COLOURS SATURATION | |
| 100% | 100 ± 25 |
| 75% | 150 ± 25 |
| 50% | 200 ± 25 |
| 25% | 250 ± 25 |
| SET BRIGHTNESS | |
| 100% | 100 ± 25 |
| 75% | 150 ± 25 |
| 50% | 200 ± 25 |
| 25% | 250 ± 25 |
| Miscellaneous | |
| Bypass/Null value | 50 ± 25 |
| Glitch/Ignore/discard | <25 |

From Table 2, the total number of variations of fixed-colour commands in the above example can be calculated as:

4*10*4=160, whereas the total number of show commands is:

6*4*4=96.

Apart from the above mentioned two-parameter commands, i.e. 160 fixed colours and 96 blending colour show commands, the design still provides for defining more commands with only one parameter or no parameter at all.

In other words, if a command has only one parameter, then the related 3DOF command message will have two valid values in any pair of OFF1, ON, or OFF2 fields and the remaining field will have a Bypass/Null value (50 ms). Considering a bypass/null value for one of the three timing components at a time, and assuming a maximum command time length of 1050 ms, the number of commands with one parameter can be calculated as:

$$9*9*1+9*1*9+1*9*9=243$$

whereas in '9*9*1' for instance, the first '9' refers to the 9 timing codes from 100 ms to 500 ms available in OFF1 field. The second '9' refers to codes available in the ON field and the '1' refers to the Bypass/Null code in the OFF2 field of the command message. The maximum length of any of those commands will be 1050 ms as mentioned earlier.

Similarly, the number of commands with no parameters can be calculated by considering two out of the 3 timing fields at bypass/null value with following permutations:

$$18*1*1+1*18*130\ 1*1*18=54$$

For example, if a command is to be sent to set a light to operate in colour show 3, without affecting show speed or brightness level, then OFF1 will have a value of 400 ms, but both ON and OFF2 will have Bypass/Null value of 50 ms. The corresponding waveform (for a DC system) is illustrated in FIG. 7.

Altogether, it is shown that there are 553 various commands provided in 1050 ms with 50 ms granularity with the encoding of Table 2 and FIG. 4 for the described embodiment. A higher number of commands is achievable for other embodiments with longer command lengths and/or shorter granularity.

It should also be noted that the allocation of the OFF1, ON, and OFF2 fields to whichever of fixed-colour code, show colour code, speed level code, saturation level code or brightness level code is arbitrary. Allocation of different time code values to the overlapping command categories is arbitrary. Therefore, a system designer can implement one of many possibilities. The three fields also can have a variety of permutations in allocations, e.g. OFF1 and OFF2 allocation can be swapped. Nevertheless, it should be noted that certain combinations may lead to shorter or longer minimum required time to convey the slowest/longest command in its entirety. Therefore, depending on the optimisation objective, a system designer may pick a suitable combination. FIGS. 8 to 10 illustrate some more (not all) possible variations and combinations that could be used.

For example, in FIG. 8 the OFF1 field is allocated to represent either fixed-colour (lower values) or show codes (upper values), the ON field is allocated for show speed or colour saturation, and the OFF2 field is allocated for brightness/dimming. It is to be noted that the slowest/longest command message takes 1350 ms to be sent.

In FIG. 9 the OFF1 field is allocated to represent either show codes (lower values) or fixed-colour (upper values), the ON field is allocated for show speed or colour saturation, and the OFF2 field is again allocated for brightness/dimming. It is to be noted that the slowest/longest command takes 1350 ms to be sent.

In FIG. 10 the OFF1 field is allocated to represent either show speed (lower values) or fixed-colour saturation (upper values), the ON field is allocated for show code or fix colour code, and the OFF2 field is again allocated for brightness/dimming. It is to be noted that the slowest/longest command takes 1250 ms to be sent.

In the above examples all command messages can be conveyed in less than about 1.5 s. This allows a user to have a satisfactory real-time control experience and feel.

As mentioned earlier, the command protocol can be extended to 5DOF, or generally mDOF (where m=2k+1, k∈{1,2,3 . . . }), to accommodate higher orders of multidimensionality within a reasonably short message time.

Light Fixture

Figure 11:
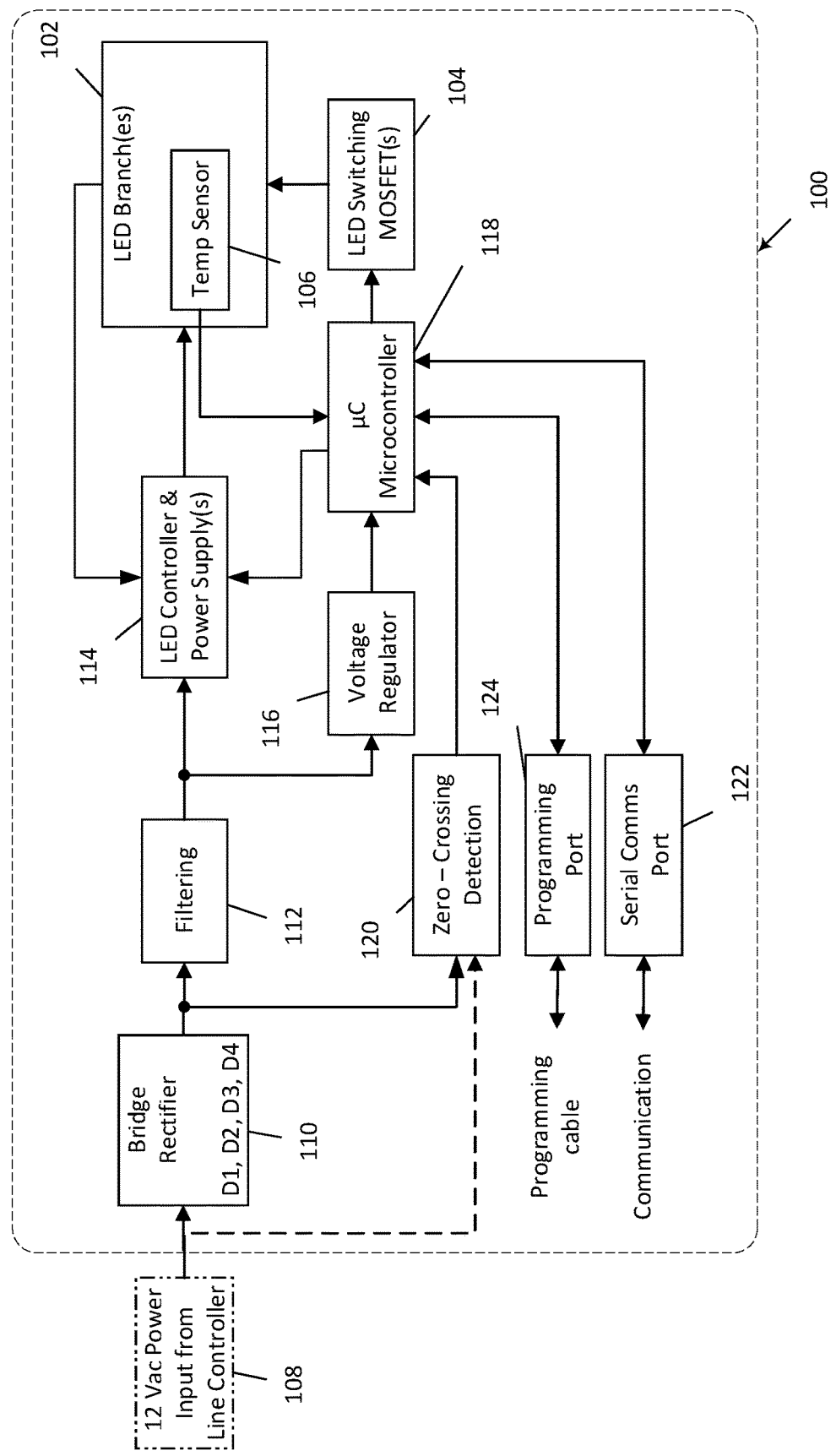
FIG. 11 shows a block diagram for a light fixture in accordance with an embodiment of the present invention.

FIG. 11 shows a block diagram for a light fixture 100 in accordance with an embodiment of the present invention. The light fixture 100 may be an LED light with an appropriate enclosure suitable for various outdoor lighting applications such as garden lights, strip lights, pool lights, spa lights, and water feature lights. Typical primary power input for these lights is 12V AC (alternating current) and in some cases, especially older lights, up to 32V AC. The input power could however be DC (direct current) rather than AC, and could be any voltage.

A single colour LED light 100 might have one or a plurality of single colour LEDs in series, parallel or combinational arrangements, hereby referred to as an LED branch or circuit 102. A multicolour LED light fixture may have more than one of these LED branches 102 with different colours. A typical multicolour LED light fixture can have a branch of White LEDs, a branch of Red, a branch of Blue, and a branch of Green LEDs. Each LED branch may have a MOSFET switch 104 to enable/disable the LED branch circuit and its operation. To monitor and control temperature generated by power consumption in the LEDs, a temperature sensor 106 in proximity of LEDs may be used.

Input power 108 is fully rectified for DC operation of the circuit using a bridge rectifier 110 incorporating four rectifying diodes. Depending on total power consumption of the circuit and other requirements, it might be possible to use half-rectifier rectification in some embodiments. Rectified input power is further filtered using filtering capacitors 112 to provide flat DC for one or a plurality of LED controller/power supply(s) 114 and a voltage regulator 116 that powers up a microcontroller (MCU) 118 and other parts of the circuit.

A zero-crossing detection circuit 120 is used to sense and monitor occurrence, presence or absence of AC half-cycles of input AC power or presence/absence of DC power. In AC operated systems, two identical zero-crossing detector circuits 120 might be used, one on each of two AC input lines to the bridge rectifier 110. The input to the zero-crossing detection circuit 120 may be either drawn from bridge rectifier 110 input, or can be drawn from its output (as shown in FIG. 11). For the latter case, a series diode (not shown) would be needed at the input of the Filtering section 112 to isolate fully/half rectified AC half-cycles from the flat DC filtered side in order to maintain the shape of the AC half-cycles intact. In DC operated systems this series diode would not be needed. In DC operated systems only one zero detection circuit is attached to the hot/positive line (rather than Ground/return line) and used.

The LED controller/power supply 114 generates DC voltage to power up a branch 102 of LEDs at a set current using a current measurement and control feedback system. This feedback system can have logic to react to extreme conditions such as high LED current. A single LED controller/power supply 114 can be used to power up only one LED branch at a time. LED branches 102 can have a dedicated LED controller/power supply 114 or one LED controller can be time shared among more than one LED branches 102.

The microcontroller (MCU) 118 is equipped with firmware comprising instructions to control all the timings and activating or monitoring signals to operate the LED controller/power supply 114, temperature sensor 106, communication port 122, zero-crossing detection 120, LED branches 102 (using LED MOSFET switch(es) 104). A programming port 124 may also be provided.

Line Controller

Figure 12:
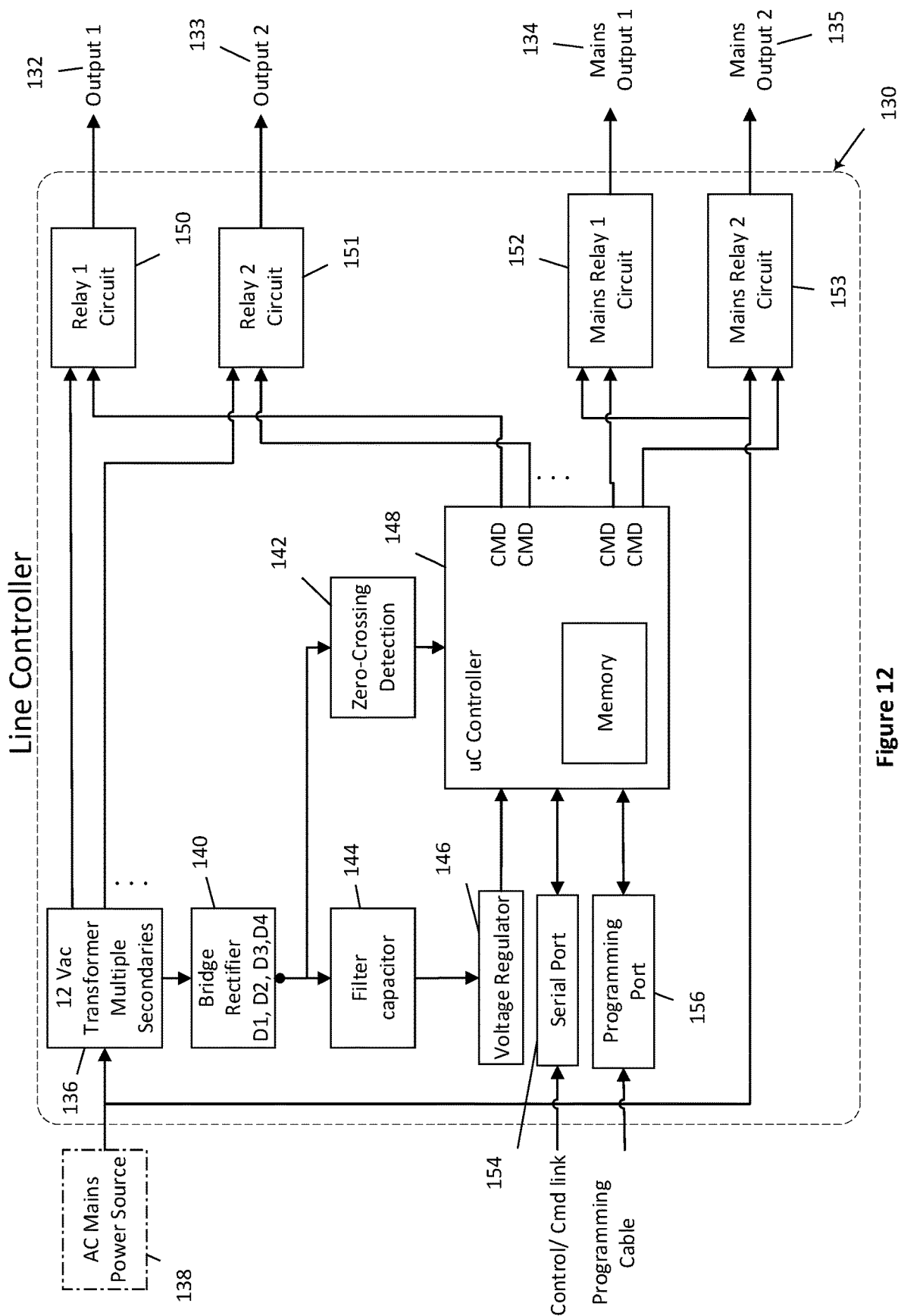
FIG. 12 shows a block diagram for a line controller in accordance with an embodiment of the present invention.

FIG. 12 shows a block diagram for a line controller 130 in accordance with an embodiment of the invention. The line controller 130 is used to power up light fixtures and send commands to them through its output power channels 132-135 to control colour mode, intensity and other controllable parameters of the connected lights 100 (FIG. 11) on each channel by interrupting output power in a predefined timing waveform.

The line controller 130 has a built-in transformer 136 with a plurality of secondary windings to step down the mains voltage to suitable 12V AC both for circuit operation and also to powering up individual output lines/channels 132, 133 for light fixtures 100. The line controller 130 may also have output lines 134, 135 operating at the same voltage as the input mains voltage 138 to power up end user transformers driving low voltage lights and possibly control other electrical equipment such as a pool pump. In some light embodiments the end user transformers or other power supplies (usually of switch-mode type) may be embedded within the light fixture 102 to lower the voltage from mains level to suitable level for LED branch(es) 102 and other parts of the circuit. A typical line controller may have any combination of the two types of output lines/channels or either of the two types.

Input power is fully rectified for DC operation of the circuit using rectifier diodes bridge 140. A zero-crossing detection circuit 142 is used to sense half-cycles of input power and to maintain the calibration of the internal software Real-time Clock (RTC) which is used for the operation of event scheduler. Fully rectified input power from the bridge rectifier 140 is further filtered using filtering capacitors 144 to provide flat DC voltage to a voltage regulator 146 that powers up a microcontroller (MCU) 148 and other parts of the circuit.

The microcontroller (MCU) 148 is equipped with firmware comprising instructions to control all the timings and activating signals to operate a plurality of output Relays 150-153 driving light fixtures 100, communication port 154 and all software features such as a scheduler/timer to automate ON and OFF times of the output relays 150-153, and to monitor zero-crossing detection 142.

A user is able to communicate with line controller 130 through its wired or wireless communication port 154 to control its operation and the connected light fixtures. A programming port 156 may also be provided to enable updating of the firmware stored in memory 158 accessible to the MCU 148.

Lighting Control System

Figure 13:
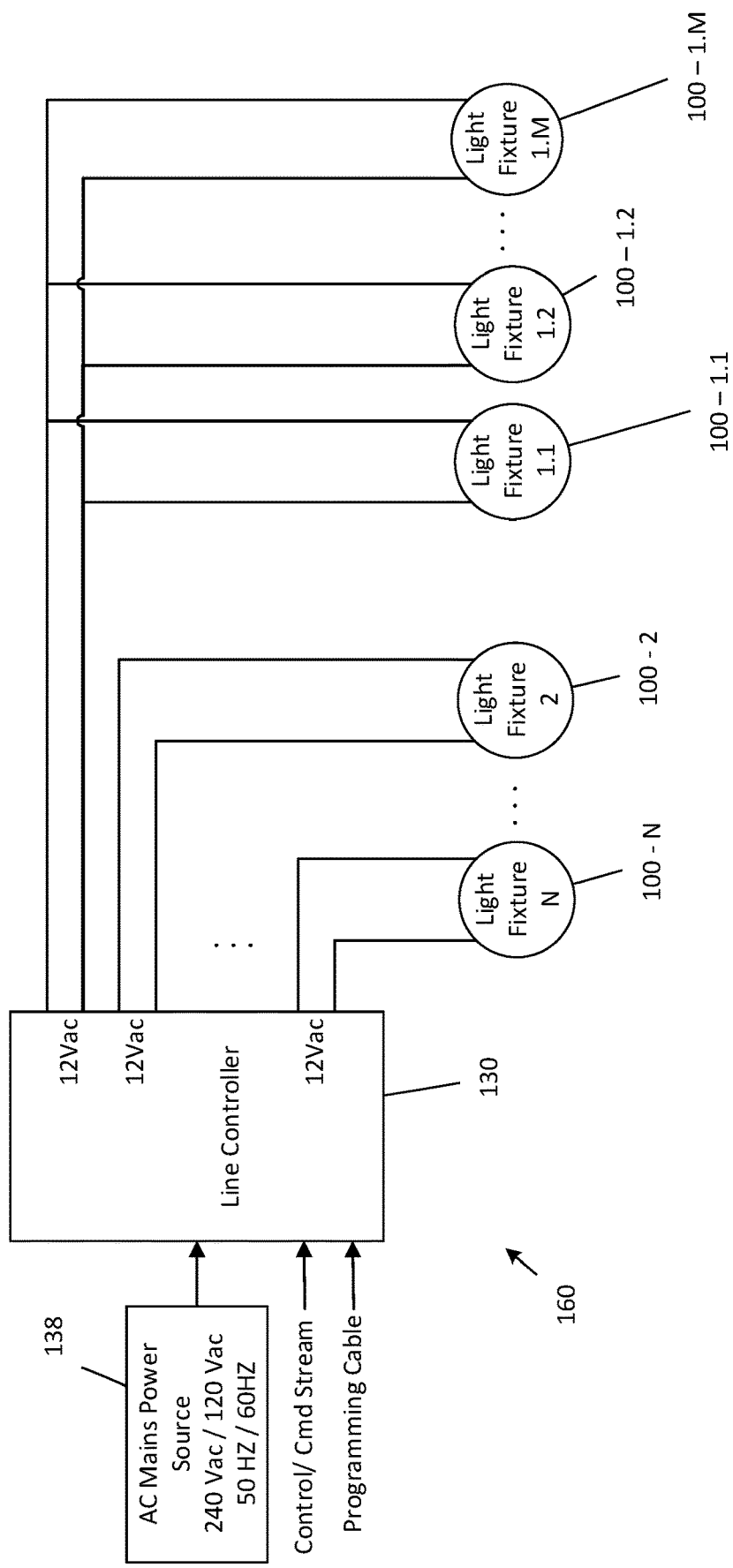
FIG. 13 shows a block diagram of a lighting system comprising the line controller of FIG. 12 together with a plurality of light fixtures as in FIG. 11.

FIG. 13 shows a block diagram of a lighting system 160 comprising a line controller 130 and a plurality of light fixtures 100-1.1 to 100-1.M and 100-2 to 100-N. Each line controller has a plurality of independent output channel relays driven by independent secondary windings of its internal 12 Vac transformer (136 in FIG. 12). Each output relay (150-153 in FIG. 12) is used to power up one or plurality of light fixtures that may operate on the same colour, brightness, saturation and show speed as the others on the same channel. On the other hand, the light fixtures 100-1.1 to 100-1.M connected the first output channel of the line controller 130 shown in FIG. 13 may be individually addressable, or addressable in groups. In the case of addressable lights, at least one of m fields of an mDOF command message (or at least one of 3 fields of a 3DOF command message) can be dedicated to encode an address that would identify an individual or a group of lights that are already preconfigured with those address(es). FIG. 13 illustrates an embodiment with only one light fixture connected to each of channels 2 . . . N of the line controller, as well as a plurality of light fixtures connected to channel 1 of the line controller.

Generating 3DOF Command Waveforms and Detecting/Decoding them

Figure 14:
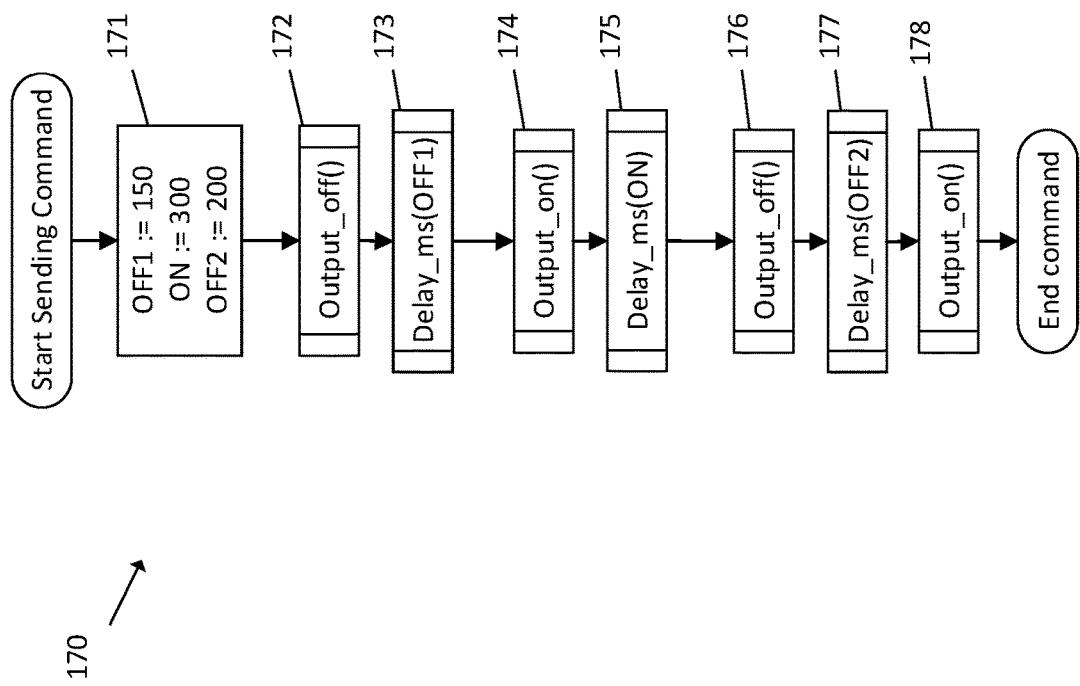
FIG. 14 shows a flowchart depicting a process for generating an example 3DOF command message at the line controller end.

FIG. 14 is a flowchart 170 depicting a process for generating an example command message at the line controller end. This figure illustrates how a line controller computer program within the lighting system 160 shown in FIG. 13 can generate a 3DOF command sequence on a power output line to control a connected light fixture 100-N for the specific command described in FIG. 5 or FIG. 6 for the embodiment of FIG. 4 and Table 2. It is presumed that the line controller output channel(s) is already On, i.e. the connected light fixture is already powered up. The Output_off( ) process 172, 176 switches the output power line off by commanding the relevant switching device 150-153 (FIG. 12) inside the line controller 130 located on its output stage. Similarly, the Output_On( ) process 174, 178 switches the output power line On so the light is powered up. The Delay_ms( ) process 173, 175, 177 delays the execution for the specified number of milliseconds as its argument, specified at step 171, so to create the requested Off or On timing interval. It should be noted that the Delay process is a simple way of describing the example and generating timing intervals can be implemented using event driven methods such as interrupts.

Figure 15:
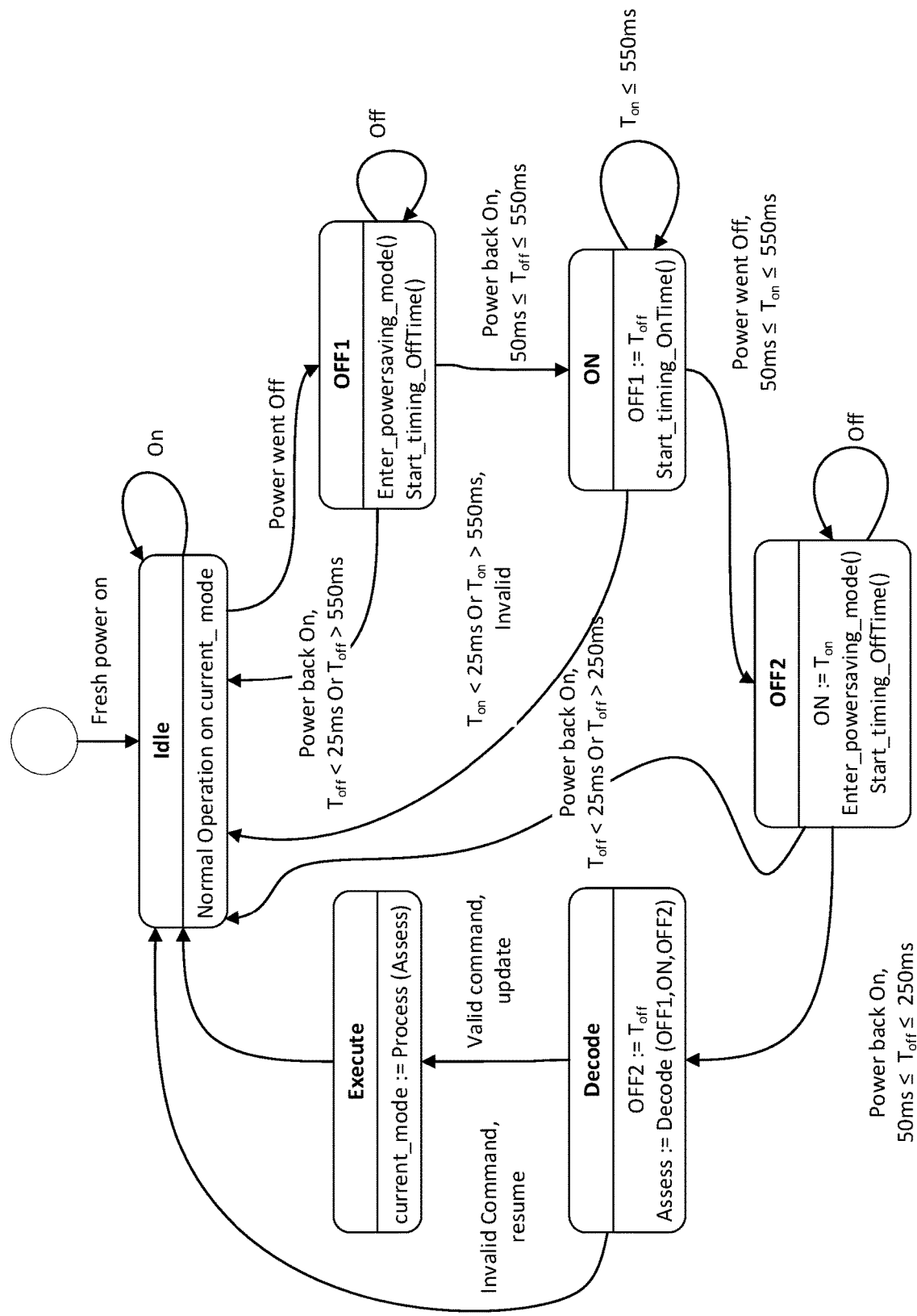
FIG. 15 shows a state diagram depicting the detection, interpretation and processing of a 3DOF command message at the light fixture end.

FIG. 15 illustrates one possible state diagram detailing how a light fixture computer program within the lighting system 160 shown in FIG. 13 can detect, interpret and process a 3DOF command such as the one described in FIG. 5 or FIG. 6 in the embodiment outlined in FIG. 4 and Table 2.

As a starting state, the light fixture is considered to be powered up and in normal operation, running in current mode (for example a fixed colour mode or a colour show mode). As power is turned off by the line controller, the light senses that event through zero-crossing detection, and other optional hardware, together with timers implemented in its program. Upon sensing power loss, the program transitions from "idle" to the "OFF1" state where it may first enter a power saving mode to ensure the hardware (including the microprocessor) still has enough energy in the absence of input power. It also starts a timer in hardware and/or software to start measuring the length of the Off time, denoted by $T_{off}$.

Upon power resumption by the line controller, the light fixture sense that event, finalises the timing measurement and depending on the value of $T_{off}$ it transitions to an appropriate next state. If $T_{off}$ is a valid value from Table 2 (50-550 ms) the program will transition to the "ON" state and record the off time measurement $T_{off}$ as OFF1, otherwise (<25 ms or >550 ms) it will return to the previous running state "idle". For instance, any value over 550 ms is considered invalid and will cause the program to transition to the "idle" state, discarding the received OFF1 interruption.

While in the ON state, the program monitors the input power up until the length of the On time exceeds a maximum valid value for the ON field from FIG. 4 and Table 2 (550 ms), upon which the program transitions to and resumes normal operation on "idle", terminating command detection and discarding the received OFF1 interruption. If the On time is within the valid range (50-550 ms in this example) when the power goes off, the program transitions to the OFF2 state, and records the On time measurement $T_{on}$ as ON.

The OFF2 state is similar to OFF1 state in that the program waits for resumption of power while progressively keeping record of length of Off time $T_{off}$. Upon resumption of power, the program stores measured $T_{off}$ as OFF2 if that value is within the valid range (50-250 ms in this example) upon which the program transitions to "Decode" state. Otherwise (<25 ms or >250 ms) it transitions to and resumes the normal operation in "idle", dismissing the two recently received power interruptions and related records.

It should be noted that for both OFF1 and OFF2 states, if the power does not resume before the circuit runs out of residual stored electrical energy to keep running in low-power mode in absence of input power, the light fixture will be completely shutdown and the next power-on will be a fresh start to the "idle" state. In this case the received power interruptions leading to OFF1 and/or OFF2 states will be dismissed.

Within the "Decode" state, the program has three values for OFF1, ON, OFF2 and can check if they constitute a valid predefined Command. If so, the program transitions to the "Execute" state where the Command gets actioned. Usually a Command changes a mode and/or dimension(s) of the light fixture from a current mode/dimension to a new mode/dimension. In the case where the Command was not valid, the program resumes to the "idle" state, dismissing the two recently received power interruptions. Depending on details of the implementation, it may be possible to incorporate the "Decode" state, and even the "Execute" state, into the OFF2 state.

Typical Installation of a Light Control System

Figure 16:
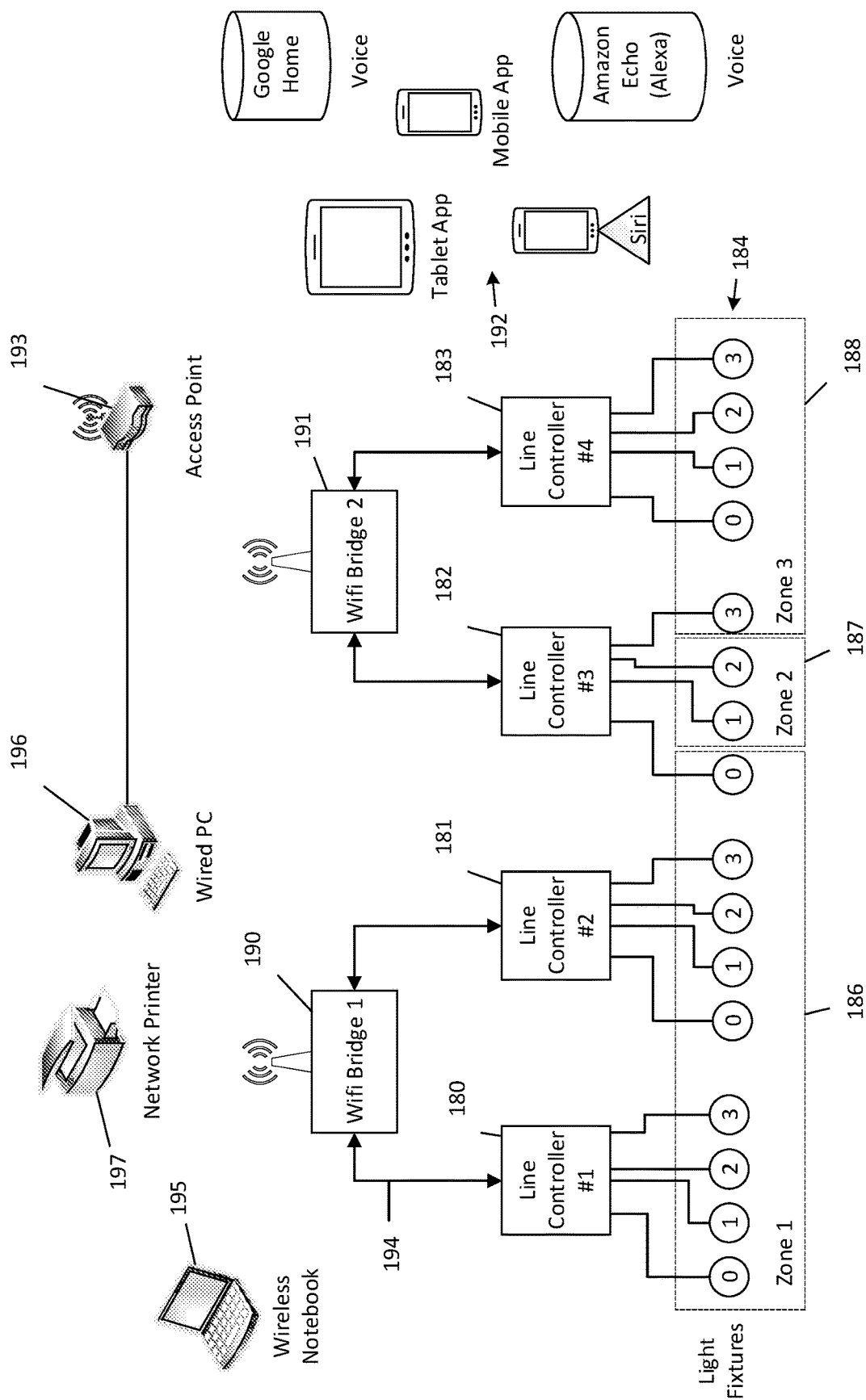
FIG. 16 shows an example installation of a pool light control system, incorporating the 3DOF protocol in accordance with an embodiment of the present invention, with modern user interfaces in a home network.

FIG. 16 depicts an example installation of a pool light control system with modern user interfaces in a home network. A line controller has a limited number of output channels and each channel has limited deliverable power to drive a limited number of connected light fixtures. For scalability of the system, a number of line controllers 180-183 may be installed in a medium to large application. To coordinate and synchronise all light fixtures 184 in one installation and also to provide flexible grouping and zoning features 186-188 of light fixtures, and enable communication between an operator and the system, WiFi Bridges 190, 191 may be installed.

A WiFi Bridge, e.g. 190, controls a plurality of connected line controllers 180, 181 on the one hand and connects to UI devices 192 such as mobile phones, tablets, voice operated devices (Amazon Echo, Google Home Assistant) on the other hand through home WiFi 193 and/or using a backend system hosted on the internet. Wireless notebooks 195 or wired PCs 196 may also be used as UIs, and peripherals such as printers 197 may also exist on the home network. A WiFi Bridge, e.g. 190, is able to send commands to each connected line controller, e.g. 180, and to receive responses or status from the line controller 180 through a serial link 194 such as RS485 or other suitable communication protocol.

As illustrated in FIG. 16, a zone of lights, e.g. 186, can span across multiple line controllers 180-183 on the same or a different WiFi Bridge 190, 191 in the hierarchy. A zone 186-188 simply includes one defined group/subset of light fixtures 184.

Although preferred embodiments of the invention are described herein in detail, it will be understood by those skilled in the art that variations may be made thereto without departing from the spirit of the invention or the scope of the appended claims.

The invention claimed is:

1. A method of controlling an operation of an electrical device within an electrical system, the method comprising the steps of:
receiving, at a line controller of the electrical system, a user-selected mode of operation for the electrical device;
wherein the user-selected mode of operation includes two dimensions associated with the user-selected mode of operation;
generating a command message corresponding to the user-selected mode of operation by operating a switching device of the line controller to selectively interrupt power to the electrical device, wherein the command message encodes the user-selected mode of operation in accordance with a multi-field command protocol comprising:
a first variable length OFF time;
a variable length ON time following the first variable length OFF time; and
a second variable length OFF time following the variable length ON time, wherein the first OFF time, the ON time and the second OFF time form three discrete fields of the command message, with each field having a value represented by its length, wherein at least one of the three fields, or the three fields together, define a command to control the electrical device in accordance with the user-selected mode of operation, and wherein the at least one of the three fields defines a parameter to control the electrical device in accordance with at least one of the two associated dimensions; and
wherein the three fields of the command message together define the command and two parameters to control the electrical device in accordance with the user-selected mode of operation and the two associated dimensions,
receiving, at the electrical device of the electrical system, the command message; and
operating the electrical device in accordance with the user-selected mode of operation and the two associated dimensions.

2. The method of claim 1, wherein the user-selected mode of operation includes a first dimension and a second dimension, each dimension being associated with the mode of operation of the electrical device, and wherein:
one of the three fields defines the command to control the electrical device in accordance with the user-selected mode of operation;
another of the three fields defines a first parameter to control the electrical device in accordance with the user-selected first dimension; and
the remaining field of the three fields defines a second parameter to control the electrical device in accordance with the user-selected second dimension.

3. The method of claim 1, wherein the electrical system comprises a lighting system, and
the electrical device comprises a light fixture,
the selectable modes of operation include static light colours and light shows comprising sequences of changing light colours, and
the selectable dimensions include at least one of brightness, colour saturation, and show speed.

4. The method of claim 1, wherein the electrical system comprises a plurality of said electrical devices connected to a power line of the electrical system, and the method further comprises the steps of:
- receiving, at the line controller, a user-selected target electrical device or group of electrical devices;
- generating the command message corresponding to the user-selected mode of operation and the targeted electrical device or group of electrical devices, such that at least one of the three fields of the command message defines an address to control the targeted electrical device or group of electrical devices in accordance with the user-selected mode of operation;
- receiving, at the plurality of electrical devices, the command message; and
- operating the targeted electrical device or group of electrical devices in accordance with the user-selected mode of operation.

5. An electrical system comprising:
- at least one controllable electrical device; and
- a line controller, connectable to the electrical device via a power line, for providing power to the electrical device and for controlling a mode of operation of the electrical device, the line controller comprising a switching device for selectively interrupting power to the electrical device in accordance with a command message corresponding to a user-selected mode of operation, wherein the user-selected mode of operation includes two dimensions associated with the mode of operation, and
- wherein the command message encodes the user-selected mode of operation and the two associated dimensions in accordance with a multi-field command protocol comprising:
  - a first variable length OFF time;
  - a variable length ON time following the first variable length OFF time; and
  - a second variable length OFF time following the variable length ON time,
- wherein the first OFF time, the ON time and the second OFF time form three discrete fields of the command message, with each field having a value represented by its length, wherein at least one of the three fields, or the three fields together, define a command to control the electrical device in accordance with the user-selected mode of operation, and wherein the at least one of the three fields defines a parameter to control the electrical device in accordance with at least one of the associated dimensions; and
  - wherein the three fields of the command message together define the command and two parameters to control the electrical device in accordance with the user-selected mode of operation and the two associated dimensions.

6. The electrical system of claim 5, wherein the user-selected mode of operation includes a first dimension and a second dimension, each dimension being associated with the mode of operation of the electrical device, and wherein:
- one of the three fields defines the command to control the electrical device in accordance with the user-selected mode of operation;
- another of the three fields defines a first parameter to control the electrical device in accordance with the user-selected first dimension; and
- the remaining field of the three fields defines a second parameter to control the electrical device in accordance with the user-selected second dimension.

7. The electrical system of claim 5, wherein the electrical system comprises a lighting system, and
- the controllable electrical device comprises a light fixture,
- the selectable modes of operation include static light colours and light shows comprising sequences of changing light colours, and
- the selectable dimensions include at least one of brightness, colour saturation, and show speed.

8. The electrical system of claim 5, comprising a plurality of said controllable electrical devices connected to the power line, wherein the line controller is configured to selectively interrupt power to the plurality of controllable electrical devices connected to the power line in accordance with the command message corresponding to the user-selected mode of operation and a user-selected target electrical device or group of electrical devices, such that at least one of the three fields of the command message defines an address to control the target electrical device or group of electrical devices in accordance with the user-selected mode of operation.

9. A line controller connectable to at least one controllable electrical device via a power line, for providing power to the electrical device and for controlling a mode of operation of the electrical device, the line controller comprising a switching device for selectively interrupting power to the electrical device in accordance with a command message corresponding to a user-selected mode of operation, wherein the user-selected mode of operation includes two dimensions associated with the mode of operation, and wherein the command message encodes the user-selected mode of operation and the two associated dimensions in accordance with a multi-field command protocol comprising:
- a first variable length OFF time;
- a variable length ON time following the first variable length OFF time; and
- a second variable length OFF time following the variable length ON time, wherein the first OFF time, the ON time and the second OFF time form three discrete fields of the command message, with each field having a value represented by its length, wherein at least one of the three fields, or the three fields together, define a command to control the electrical device in accordance with the user-selected mode of operation, and wherein the at least one of the three fields defines a parameter to control the electrical device in accordance with at least one of the two associated dimensions; and
  - wherein the three fields of the command message together define the command and two parameters to control the electrical device in accordance with the user-selected mode of operation and the two associated dimensions.

10. The line controller of claim 9, wherein the user-selected mode of operation includes a first dimension and a second dimension, each dimension being associated with the mode of operation of the electrical device, and wherein:
- one of the three fields defines the command to control the electrical device in accordance with the user-selected mode of operation;
- another of the three fields defines a first parameter to control the electrical device in accordance with the user-selected first dimension; and
- the remaining field of the three fields defines a second parameter to control the electrical device in accordance with the user-selected second dimension.

11. The line controller of claim 9, wherein the mode of operation and the two associated dimensions are selectable by the user in a single interaction, and wherein the line controller encodes the user-selected mode of operation and the two associated dimension(s) in a single command message.

12. The line controller of claim 9, wherein the electrical system comprises a lighting system, and
the controllable electrical device comprises a light fixture,
the selectable modes of operation include static light colours and light shows comprising sequences of changing light colours, and
the selectable dimensions include at least one of brightness, colour saturation, and show speed.

13. The line controller of claim 9, connectable to a plurality of said controllable electrical devices via the power line, wherein the line controller is configured to selectively interrupt power to the plurality of electrical devices connected to the power line in accordance with the command message corresponding to the user-selected mode of operation and a user-selected target electrical device or a target group of electrical devices, such that at least one of the three fields of the command message defines an address to control the target electrical device or the target group of electrical devices in accordance with the user-selected mode of operation and any the two associated dimensions.

14. A controllable electrical device operable within an electrical system and having a plurality of selectable modes of operation,
the controllable electrical device being connectable to a power line of the electrical system and being configured to detect selective interruptions of power on the power line representing a command message corresponding to a user-selected mode of operation and two dimensions associated with the mode of operation, wherein the user-selected mode of operation and the two associated dimensions are encoded within the command message in accordance with a multi-field command protocol comprising:
a first variable length OFF time;
a variable length ON time following the first variable length OFF time; and
a second variable length OFF time following the variable length ON time, wherein the first OFF time, the ON time and the second OFF time form three discrete fields of the command message, with each field having a value represented by its length, and at least one of the three fields, or the three fields together, define a command to control the electrical device in accordance with the user-selected mode of operation, and
wherein the electrical device comprises a microcontroller configured to decode the command message having encoded therein the user-selected mode of operation and two user-selected dimensions associated with the mode of operation,
the user-selected mode of operation being identified within the command message by a mode command defined by one of the three fields,
a first user-selected dimension being identified within the command message by a first parameter defined by another of the three fields, and
a second user-selected dimension being identified within the command message by a second parameter defined by the remaining field of the three fields, and
wherein the microcontroller is configured to operate the electrical device in accordance with the user-selected mode of operation and the two associated dimensions.

15. The controllable electrical device of claim 14, wherein the device comprises a light fixture,
the selectable modes of operation include static light colours and light shows comprising sequences of changing light colours, and
the selectable dimensions include at least one of brightness, colour saturation, and show speed.

16. The controllable electrical device of claim 15 wherein the modes of operation and the two associated dimensions form lighting profiles of the light fixture.

* * * * *